(12) United States Patent
Mearini

(10) Patent No.: US 9,558,724 B2
(45) Date of Patent: Jan. 31, 2017

(54) GUITAR PICK HAVING CVD DIAMOND OR DLC COATING

(71) Applicant: Gerald T. Mearini, Shaker Heights, OH (US)

(72) Inventor: Gerald T. Mearini, Shaker Heights, OH (US)

(*) Notice: Subject to any disclaimer, the term of this patent is extended or adjusted under 35 U.S.C. 154(b) by 0 days.

(21) Appl. No.: 14/974,260

(22) Filed: Dec. 18, 2015

(65) Prior Publication Data

US 2016/0180824 A1    Jun. 23, 2016

Related U.S. Application Data

(60) Provisional application No. 62/093,829, filed on Dec. 18, 2014.

(51) Int. Cl.
| | | |
|---|---|---|
| *G10D 3/16* | (2006.01) | |
| *C23C 16/26* | (2006.01) | |
| *C23C 16/27* | (2006.01) | |

(52) U.S. Cl.
CPC .............. *G10D 3/163* (2013.01); *C23C 16/26* (2013.01); *C23C 16/27* (2013.01)

(58) Field of Classification Search
CPC .................................................... G10D 3/163
See application file for complete search history.

(56) References Cited

U.S. PATENT DOCUMENTS

| 5,126,206 A  * | 6/1992  | Garg .................... C23C 16/271 428/332 |
|---|---|---|
| 5,147,687 A  * | 9/1992  | Garg .................... C23C 16/271 427/122 |
| 5,160,544 A  * | 11/1992 | Garg .................... C23C 16/271 118/724 |
| 5,190,807 A  * | 3/1993  | Kimock ................ C23C 16/006 428/216 |
| 5,508,368 A  * | 4/1996  | Knapp ................ C23C 16/0245 347/203 |
| 5,527,596 A  * | 6/1996  | Kimock .................. B32B 17/06 428/216 |
| 6,120,910 A  * | 9/2000  | Szenics .................. G10D 1/005 428/408 |
| 6,306,466 B1 * | 10/2001 | Feldstein ................ C23C 18/31 427/437 |
| 7,714,218 B2 * | 5/2010  | Papenfus .................. G10D 3/06 84/314 R |
| 8,110,729 B2 * | 2/2012  | Guthrie .................. G10D 1/005 84/298 |

(Continued)

*Primary Examiner* — Robert W Horn
(74) *Attorney, Agent, or Firm* — Fay Sharpe LLP

(57) ABSTRACT

A guitar pick comprises a substrate layer and a diamond film layer or coating. The diamond film layer is composed of chemical vapor deposited diamond, or diamond-like carbon. The diamond film coating or layer is applied to the substrate in one or more layers under intense heat and low pressure. The substrate layer can be composed of at least one of steel, stainless steel, molybdenum, titanium, tungsten, copper, aluminum, tantalum and alloys thereof, silicon, silicon carbide, tungsten carbide, quartz, or sapphire. Coating of the diamond film layer may be achieved by plasma enhanced chemical vapor deposition (PECVD), ion beam deposition (IBD), plasma-assisted deposition, cathodic arc deposition, hot filament chemical vapor deposition (HFCVD), or microwave plasma-assisted chemical vapor deposition (MPCVD).

13 Claims, 1 Drawing Sheet

(56) References Cited

U.S. PATENT DOCUMENTS

| | | | | |
|---|---|---|---|---|
| 8,147,601 B2* | 4/2012 | Feldstein | ................ | C23C 18/31 |
| | | | | 106/1.22 |
| 8,231,795 B2* | 7/2012 | Martin | .................... | H04R 1/30 |
| | | | | 216/2 |
| 8,269,083 B2* | 9/2012 | Papenfus | ................. | G10D 3/06 |
| | | | | 84/314 R |
| 2004/0040432 A1* | 3/2004 | Erickson | .................. | G10D 3/14 |
| | | | | 84/306 |
| 2005/0172785 A1* | 8/2005 | Fisher-Robbins | ...... | A63J 17/00 |
| | | | | 84/464 R |
| 2006/0081109 A1* | 4/2006 | James | ................... | G10D 3/163 |
| | | | | 84/322 |
| 2014/0041506 A1* | 2/2014 | Jones | ...................... | G10D 3/10 |
| | | | | 84/297 S |
| 2015/0047493 A1* | 2/2015 | Leadbetter | ............... | G10H 1/44 |
| | | | | 84/454 |
| 2016/0180824 A1* | 6/2016 | Mearini | ................. | G10D 3/163 |
| | | | | 84/322 |

* cited by examiner

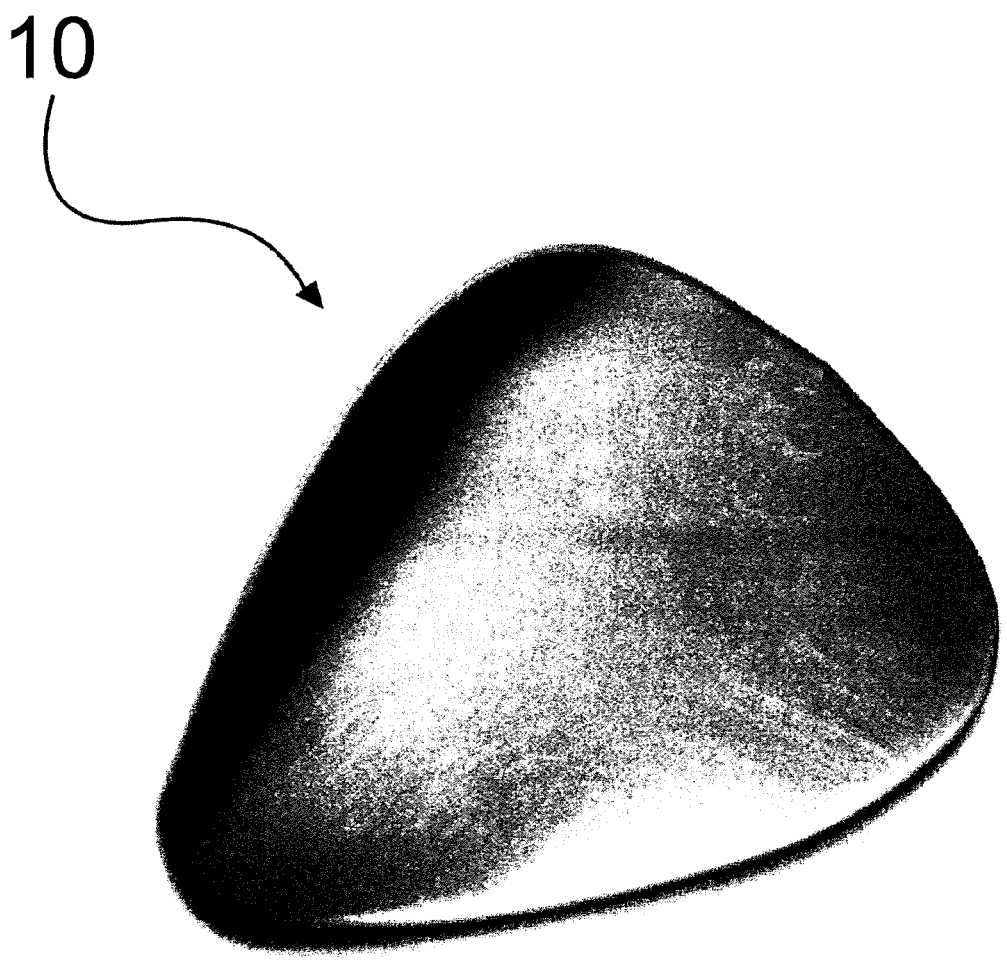
10

GUITAR PICK HAVING CVD DIAMOND OR DLC COATING

This application claims the priority benefit of U.S. provisional application Ser. No. 62/093,829, filed Dec. 18, 2014, the entire disclosure of which is expressly incorporated herein by reference.

BACKGROUND

The present disclosure relates to a guitar pick or other compatible components having a hard, wear resistant coating that has a low coefficient of friction.

Diamond-like carbon (DLC) coating is a nanocomposite coating that has many of the unique, most desirable qualities of pure diamond. With DLC coating, the value of such coatings accrues from the ability to provide some of the desirable qualities of diamond to the surfaces of almost any substrate. The most desirable qualities include high hardness, low coefficient of friction, high adhesive wear resistance, high corrosion resistance, fretting resistance, and great adhesion to substrate materials. For these reasons, DLC is particularly desirable for many tribological applications and that experience extreme contact pressure, both in rolling and sliding contact. As such, DLC is commonly used to prevent abrasive wear on razor blades and metal cutting tools, such as drill bits.

The growth of diamond directly on a substrate allows for the addition of many of pure diamond's most desirable qualities to other materials. Chemical vapor deposition (CVD) can be used to produce a synthetic diamond coating by creating the circumstances necessary for carbon atoms in a gas to grow in crystalline form. It can take up to one month to produce a synthetic diamond by CVD. To retard the formation of built-up edges, CVD diamond coating can be employed due to its high chemical stability and the resulting low affinity to non-ferrous materials as well as the resulting low coefficient of friction. For these reasons, the use of CVD diamond is particularly desirable and such diamond films are commonly grown on valve rings, cutting tools, and other objects that can benefit from diamond's most desirable qualities, specifically its hardness, scratch resistance, and exceedingly low wear rate.

It would be desirable to produce a CVD diamond or DLC coated guitar pick with high wear resistance, high hardness, and an exceedingly low wear rate because, unlike a conventional plastic or composite guitar pick, a CVD diamond or DLC coated guitar pick does not absorb as many harmonics during an initial attack on a stringed instrument, which may allow for richer sound to be achieved. Such a guitar pick would additionally offer certain benefits since the guitar pick would be engineered for high performance and not subject to fail prematurely due to its exceedingly low wear rate.

BRIEF DESCRIPTION

The present application discloses a guitar pick having a CVD diamond or DLC coating. The guitar pick comprises a substrate layer and a diamond film layer.

The substrate layer may be composed of any suitable material capable of bonding with CVD diamond or DLC coating or any other diamond-like carbon coating process. For CVD diamond, the substrate layer must be capable of withstanding intense heat (typically more than 1500° Fahrenheit) and low pressure (typically in the range of 0.1-0.4 psi) in a CVD diamond laboratory. Exemplary substrates include, but are not limited to, steel, stainless steel, molybdenum, titanium, tungsten, copper, aluminum, tantalum and alloys thereof, silicon, silicon carbide, tungsten carbide, quartz, or sapphire.

The diamond film layer may be applied as a single layer or multiple layers to the substrate. For coating of the diamond film, a CVD or DLC method is preferably used. Exemplary diamond coating processes include, but are not limited to, plasma enhanced chemical vapor deposition (PECVD), ion beam deposition (IBD), plasma-assisted deposition, cathodic arc deposition, hot filament chemical vapor deposition (HFCVD), or microwave plasma-assisted chemical vapor deposition (MPCVD).

The diamond growth on the substrate results in a guitar pick with qualities that mimic many of the most desirable characteristics of natural diamonds, including high hardness, a low coefficient of friction, high resistance to scratch, and high wear resistance.

These and other non-limiting characteristics and advantages of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

FIG. 1 is a top perspective view of a first exemplary embodiment of a guitar pick of the present disclosure.

DETAILED DESCRIPTION

A more complete understanding of the components, processes and apparatuses disclosed herein can be obtained by reference to the accompanying drawings. These figures are merely schematic representations based on convenience and the ease of demonstrating the present disclosure, and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The singular forms "a," "an," and "the" include plural referents unless the context clearly dictates otherwise.

As used in the specification, various devices and parts may be described as "comprising" other components. The terms "comprise(s)," "include(s)," "having," "has," "can," "contain(s)," and variants thereof, as used herein, are intended to be open-ended transitional phrases, terms, or words that do not preclude the possibility of additional components. However, such description should be construed as also describing the devices and parts as "consisting of" and "consisting essentially of" the enumerated components, and excluding other components.

Numerical values should be understood to include numerical values which are the same when reduced to the same number of significant figures and numerical values which differ from the stated value by less than the experimental error of the conventional measurement technique used to determine the value.

As used herein, approximating language may be applied to modify any quantitative representation that may vary without resulting in a change in the basic function to which it is related. Accordingly, a value modified by a term or terms, such as "about" and "substantially," may not be limited to the precise value specified, in some cases. The modifier "about" should also be considered as disclosing the range defined by the absolute values of the two endpoints. For example, the expression "from about 2 to about 4" also discloses the range "from 2 to 4."

Some of the terms used herein are relative terms. For example, the terms "front" and "rear" and "forward" and "rearward" are relative to a center, with the front being located opposite to the rear and an element that extends "forward" always extending away from the center in a direction opposite an element that extends "rearward." The terms "top" and "bottom" and "upward" and "downward" are relative to an absolute reference, i.e. the surface of the earth. Put another way, a top location is always located at a higher elevation than a bottom location and an element that extends "upward" always extends away from the surface of the earth, whereas an element that extends "downward" extends toward the surface of the earth. The term "horizontal" indicates a direction that is parallel with the surface of the earth. As used herein, the front and rear are located along an x-axis, the left and right are located along a y-axis, and the top and bottom are located along a z-axis, wherein the three axes are perpendicular to each other.

The terms "plane" and "planar" should be construed in a layman's manner to refer generally to a common level, and should be construed as referring to a volume, not as a flat surface.

The term "parallel" should be construed in a layman's manner as two edges or faces generally continuously having the same distance between them, and should not be strictly construed in mathematical terms as requiring that the two edges or faces cannot intersect when extended for an infinite distance. Similarly, the term "perpendicular" should not be construed as requiring that two faces meet at an angle of absolutely 90°.

The term "substantially" as used herein refers to a variance of plus/minus 5% (±5%) when used in conjunction with a numerical value.

In the area of diamond growth, the term "diamond" is used to describe any material composed primarily of $sp^3$ bonded. As such, the term "diamond" as used herein should be construed in a layman's manner to refer to any or all of natural diamond, CVD diamond, or DLC coatings.

The present disclosure relates to a guitar pick having a CVD diamond or DLC coating or layer. In particular, the guitar pick has many of the most desirable characteristics of natural diamonds, including high hardness, a low coefficient of friction, high resistance to scratch, and high wear resistance.

FIG. 1 is a top perspective view of a first exemplary embodiment of a guitar pick of the present disclosure.

Guitar pick 10 is comprised of a substrate layer and a diamond film coating or layer. The hard diamond film coating can be applied over select portions of the guitar pick or over the entirety of the pick.

For coating of the diamond film, a CVD or DLC method is preferably used. Exemplary diamond coating processes include, but are not limited to, plasma enhanced chemical vapor deposition (PECVD), ion beam deposition (IBD), plasma-assisted deposition, cathodic arc deposition, hot filament chemical vapor deposition (HFCVD), or microwave plasma-assisted chemical vapor deposition (MPCVD).

The diamond film may be applied as a single layer or multiple layers to a substrate. Exemplary substrates include, but are not limited to, steel, stainless steel, molybdenum, titanium, tungsten, copper, aluminum, tantalum and alloys thereof, silicon, silicon carbide, tungsten carbide, quartz, or sapphire. The substrate and the resultant coated substrate are the size, shape, and thickness of a conventional guitar pick made from typical materials.

Using CVD, a diamond film can be grown over the substrate in a CVD diamond laboratory under intense heat (typically more than 1500° Fahrenheit) with control over the properties of the diamond produced. The growth of diamond directly on the substrate allows for the addition of many of natural diamond's most desirable qualities to guitar pick 10. CVD can be used to produce the diamond film by creating the circumstances necessary for carbon atoms in a gas to settle on the substrate in crystalline form. More specifically, CVD diamond growth typically occurs under low pressure (typically in the range of 0.1-0.4 psi) and involves feeding varying amounts of gas into a chamber, emerging those gases, and providing conditions for diamond growth on the chosen substrate. The gases will always include a carbon source and typically include other gases, such as hydrogen, though the amounts of gases used varies greatly depending on the type of diamond to be grown. Exemplary energy sources include, but are not limited to, microwave power and arc discharges, amongst others. The CVD diamond growth on the substrate results in guitar pick 10 having qualities that mimic many of the most desirable characteristics of natural diamonds, including high hardness, a low coefficient of friction, high resistance to scratch, and high wear resistance.

DLC coating is a nanocomposite coating that has many of the unique, most desirable qualities of pure diamond. With DLC coating, the value of such coatings accrues from their ability to provide some of the desirable qualities of diamond to the surfaces of almost any substrate. DLC coatings can have different structures and properties that rely on the ratio of $sp^3$ (diamond) and $sp^2$ (carbon) or other fillers, such as silicon or metal in the substrate. In the case of DLC coating, the first carbon ions impact the surface of the substrate to be DLC coated. If the substrate is composed of a carbide-forming substance (such as Ti or Fe in steel), a layer of carbide will be formed that is later bonded to the DLC grown on top of the substrate. Other suitable methods of bonding include depositing multiple intermediate layers with atomic spacings grading from those of the substrate to those characteristic of $sp^3$ bonded carbon. The DLC coating on the substrate results in guitar pick 10 having qualities that mimic many of the most desirable characteristics of natural diamonds, including high hardness, a low coefficient of friction, high resistance to scratch, and high wear resistance.

While the present disclosure relates primarily to a guitar pick having a CVD diamond or DLC coating, it is to be understood that the previously described CVD diamond and DLC coatings can be applied to other musical hardware such as nuts, bridges, tremolo assemblies, pick guards, truss rod covers, turners, knobs, strap hooks, wire jacks, or any other piece that would benefit from an extremely scratch-resistant, wear-resistant, low-friction diamond coating. Again, the size, shape, and/or thickness of the substrate, as well as the resultant coated component, is the same as the conventional component made from typical materials. The same processes described above with respect to making a CVD or DLC pick apply to forming these other coated components which thereby include some or all of the benefits and properties described above in connection with the guitar pick.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

I claim:

1. A guitar pick comprising:
   a thin body having first and second planar surfaces that have a dimension substantially larger than a thickness dimension defined between the first and second planar surfaces; and
   a diamond coating received on at least portions of at least one of the first and second planar surfaces forming a scratch-resistant, wear-resistant, low-friction surface.

2. The guitar pick of claim 1 wherein the diamond coating is received on both of the first and second surfaces.

3. The guitar pick of claim 2 wherein the diamond coating extends over an entirety of an external perimeter surface of the thin body.

4. The guitar pick of claim 1 wherein the diamond coating is one of a natural diamond, or a synthetic diamond.

5. The guitar pick of claim 4 wherein the synthetic diamond is one of a chemical vapor deposition (CVD) or a diamond-like carbon (DLC) coating.

6. The guitar pick of claim 1 wherein the body is one of a plastic, or a single or multi-layer substrate.

7. The guitar pick of claim 6 wherein the substrate is one of steel, stainless steel, molybdenum, titanium, tungsten, copper, aluminum, tantalum and alloys thereof, silicon, silicon carbide, tungsten carbide, quartz, and sapphire.

8. A process of forming a guitar pick comprising:
   providing a body of the guitar pick; and
   coating at least a portion of a surface of the body with a natural or synthetic diamond layer.

9. The process of claim 8 wherein the body providing step includes forming the body of one of a plastic, or a single or multi-layer substrate.

10. The process of claim 9 wherein the body forming step includes selecting the substrate from one of steel, stainless steel, molybdenum, titanium, tungsten, copper, aluminum, tantalum and alloys thereof, silicon, silicon carbide, tungsten carbide, quartz, and sapphire.

11. The process of claim 8 wherein the synthetic diamond layer coating step includes using one of a depositing a chemical vapor (CVD) or applying a diamond-like carbon (DLC) coating.

12. The process of claim 8 wherein the coating step includes coating an entire outer perimeter surface of the hardware component.

13. The process of claim 8 wherein the synthetic diamond layer coating step includes using one of a depositing a chemical vapor (CVD) or applying a diamond-like carbon (DLC) coating to an entire outer perimeter surface of the guitar pick.

* * * * *